(12) United States Patent
Mynbaeva et al.

(10) Patent No.: US 6,579,359 B1
(45) Date of Patent: Jun. 17, 2003

(54) METHOD OF CRYSTAL GROWTH AND RESULTED STRUCTURES

(75) Inventors: Marina Mynbaeva, St. Petersburg (RU); Denis Tsvetkov, Gaithersburg, MD (US); Vladimir Dmitriev, Gaithersburg, MD (US); Alexander Lebedev, St. Petersburg (RU); Nataliya Savkina, St. Petersburg (RU); Alexander Syrkin, Gaithersburg, MD (US); Stephen Saddow, Starkville, MI (US); Karim Mynbaev, St. Petersburg (RU)

(73) Assignee: Technologies and Devices International, Inc., Gaithersburg, MD (US)

( * ) Notice: Subject to any disclaimer, the term of this patent is extended or adjusted under 35 U.S.C. 154(b) by 0 days.

(21) Appl. No.: 09/585,331

(22) Filed: Jun. 2, 2000

Related U.S. Application Data (60) Provisional application No. 60/137,515, filed on Jun. 2, 1999.

(51) Int. Cl.$^7$ ................................................ C30B 25/18
(52) U.S. Cl. ........................... 117/94; 117/95; 117/107; 117/108; 117/952
(58) Field of Search ............................... 117/94, 95, 107, 117/108, 952

(56) References Cited

U.S. PATENT DOCUMENTS

| 5,380,556 | A | * | 1/1995 | Hocquellet | ................. 427/228 |
| 5,776,391 | A | * | 7/1998 | Sibley | ..................... 264/81 |
| 5,939,732 | A | * | 8/1999 | Kurtz et al. | ................. 257/77 |
| 6,210,987 | B1 | * | 4/2001 | Kurtz et al. | ................. 438/47 |

FOREIGN PATENT DOCUMENTS

JP            09-080202 A    *  3/1997    .................. 117/94

* cited by examiner

Primary Examiner—Robert Kunemund
(74) Attorney, Agent, or Firm—McDermott, Will & Emery (57) ABSTRACT

A method is disclosed for fabricating monocrystal material with the bandgap width exceeding 1.8 eV. The method comprises the steps of processing a monocrystal semiconductor wafer to develop a porous layer through electrolytic treatment of the wafer at direct current under UV-illumination, and epitaxially growing a monocrystal layer on said porous layer. Growth on porous layer produces semiconductor material with reduced stress and better characteristics than with the same material grown on non-porous layers and substrates. Also, semiconductor device structure comprising at least one layer of porous group III material is included.

24 Claims, 7 Drawing Sheets

METHOD OF CRYSTAL GROWTH AND RESULTED STRUCTURES

This application claims priority of U.S. provisional patent application No. 60/137,515 filed on Jun. 2, 1999.

FIELD OF THE INVENTION

The present invention relates to the epitaxial growth of semiconductor materials in a manner which produces monocrystal material with improved characteristics, and to the structures based on such material. In particular, the invention relates to a method of fabricating semiconductor materials with the bandgap width exceeding 1.8 eV on a porous layer of a monocrystal semiconductor material.

BACKGROUND OF THE INVENTION

Semiconductor materials with bandgap width exceeding 1.8 eV have, long been considered as materials of choice for high temperature and high power devices, due to their high thermal conductivity and robust mechanical and chemical properties. They are also required in green, blue, violet and UV-bandwidth optoelectronics, because their bandgap values correspond to these areas of the spectrum. Of those materials, most commonly used today are Silicon Carbide, Gallium Nitride, Aluminum Nitride, and related materials, such as BN, AlGaN, etc. Devices based on these materials are currently on the industrial market and proved to be invaluable in many areas, starting from consumer electronics and up to avionics and space based power systems. However, the production of commercial devices based on abovementioned materials is still fighting with serious problems related to the quality of the original material. Despite the progress in bulk crystal growth techniques and the development of modern advanced technologies, the actual quality of wide bandgap epitaxial materials still restricts possible high-power and high-temperature device applications of these materials. Though it is possible today to grow wafers of these materials as large as 5 inches in diameter, the whole area of these wafers cannot be used for device structures because of a number of structural and point defects present in the wafer. That makes small device structure based on pieces cut from the wafer more expensive and prevents the fabrication of very-large-area devices needed for extremely high current densities required in to-day's power devices.

So, it is believed that the key element in the development of wide-bandgap semiconductor electronics is a proper substrate. The main limiting factors currently precluding the wider use of silicon carbide epitaxial layers is relatively high defect density in silicon carbide substrates, while for group III nitride materials the problem is in a substrate as such. In the case of SiC, defects from the substrate penetrate inside the bulk SiC crystals and epitaxial layers grown on the said substrate. These defects are limiting material characteristics and device performance.

There is no material which could be used as a native substrate for epitaxial growth of group III nitride materials, and poor lattice match and difference in thermal expansion coefficients with foreign substrates being currently used for epitaxial growth of group III nitride layers make these layers quite strained, with average value of biaxial stress ranging up to 1 GPa. This stress affects both structural and electric properties of the layers and devices built on such layers cannot take full advantage of intrinsic properties of the materials. Some researches have attempted to solve the problem by growing epitaxial layers on various buffer layers, such as thin AlGaN layer on SiC wafer for the growth of GaN epitaxial layer, on which the device structure would be based. This attitude helps, yet defects such as so called nanopipes, inclusions, dislocations and stacking faults that are present in the original substrate wafer still propagate in epitaxial structure that is grown on that substrate and eventually lead to the device degradation at particular power and/or temperature levels.

OBJECTS AND SUMMARY OF THE INVENTION

Therefore, it is an object of the present invention to provide monocrystal epitaxial layers of wide bandgap semiconductors with improved structural, electrical and optical characteristics and resulted structures with improved performance.

The invention meets this object with a method of growing semiconductor materials on a porous monocrystal layer being made of material with the bandgap width exceeding 1.8 eV. This porous layer is produced during the first step of fabricating the material, through electrolytic treatment of the wafer at direct current under or without UV-illumination.

In another aspect, the invention comprises a method of fabricating group III nitride material using the abovementioned two-steps fabricating process.

In yet another aspect, the invention comprises a method of fabricating Silicon Carbide monocrystal layer using the abovementioned two-steps fabricating process.

In yet another aspect, the invention comprises a semiconductor device comprising at least one layer of porous group III material, where this material has an average pore spacing of less than 1 micron.

These and other objects are further understood from the following detailed description of particular embodiments of the invention. It is understood, however, that the invention is capable of extended application beyond the precise details of these embodiments. Changes and modifications can be made to the embodiments that do not affect the spirit of the invention, nor exceed its scope, as expressed in the appended claims. The embodiments are described with particular reference to the accompanying drawings, wherein:

DETAILED DESCRIPTION

In accordance with the invention, a semiconductor material monocrystal wafer is provided initially. This wafer is obtained in any conventional manner, for example, grown epitaxially or sliced from a bulk material, depending on the availability of the wafers of particular materials. The wafer may comprise one of more epitaxial layers. The wafer then may be etched chemically, in a particular etchant, for example, molten potassium hydroxide for silicon carbide wafers, or subjected to reactive ion etching, to remove crystal surface defects. The wafer then is being processed to develop a porous layer. Porous layer may be fabricated by different ways. For example, the wafer is glued to a metal disk with conducting glue. To avoid a contact between the metal part of the disk and the electrolyte, in which the disk will be placed, VAX masking is used. Also, platinum grid is prepared, which will be used as a cathode during the wafer processing. Then, 4%-aqueous electrolyte solution must be made from fluoride acid and distilled water. After that, the wafer glued to the disk is placed in electrochemical cell, which is a Teflon vessel of 1 l volume with screw-on cathode. A direct current is applied, for example, from a standard BP-49 direct current supply. The current value is applied according to the square of the wafer to get the necessary current density, which is normally between 10 and 20 mA/cm$^2$. Then the Hg lamp is switched on to produce the UV-illumination. Standard mercury lamp of 250 W is a normal light source for this procedure. The duration of this current-controlled process normally varies from 1 to 10 minutes, after which the lamp and the current source are switched off. The sample is rinsed in running water, and both VAX and conducting glue are removed with acetone. Thus the first step of fabricating the material, namely, processing a monocrystal wafer to develop a porous layer, is completed. In some cases, porous materials were formed without UV illumination.

The second step comprises epitaxial growth of a monocrystal layer on said porous layer. The layer may be produced in different forms including a form of thin epitaxial layer or in a form of bulk crystal. The growth method should be appropriate for the material being fabricated. For silicon carbide it can be liquid phase epitaxy, or sublimation, or chemical vapor deposition, or any other method. For group III nitrides it can be hydride vapor phase epitaxy, or metal organic chemical vapor deposition, bulk growth from a melt-solution or any other method. The growth conditions of the methods would be the same as for the epitaxial growth of monocrystal layers on conventional substrates without porous layers.

EXAMPLE 1

Group III nitride monocrystal layer, namely Gallium Nitride layer was fabricated using the method. Original wafer consists of GaN 0.4 micron thick epitaxial layer of n-type with $N_d-N_a=10^{17}$ cm$^{-3}$, grown by hydride vapor phase epitaxy (HVPE) technique on 6H—SiC substrate. Porous layer was obtained by anodization of GaN layer in anodic 4% aqueous HF solution under 10 mA/cm$^2$ current density at 5 minutes. The process was carried out in the electrochemical cell under UV illumination from 250-Watt Hg lamp and yielded a porous layer with the thickness of about 3 microns. The second fabrication step included epitaxial growth of GaN layer on said porous layer. The growth was conducted by hybrid vapor phase epitaxy and the thickness of the grown layer was 5 microns.

In the structure so fabricated, as confirmed by Scanning Electron Microscopy data, GaN/porous GaN interface was flat, and pores did not lead to the growth of any visible defects in the epitaxial layer. The as-grown surface of fabricated epitaxial layer was smooth and the Atomic Force Microscopy study of the surface roughness showed the presence of growth steps as high as 5 nm. The crystal quality of GaN layer so fabricated was studied through the measurements of a full width at half maximum (FWHM) of the X-ray diffraction rocking curves. The angular distribution of the X-ray diffraction corresponding to (0002), (0004) and (1124) reflections was measured by means of triple-crystal diffractometry on CuK$_{\alpha 1}$ radiation under conditions of symmetrical and asymmetrical Bragg-geometry. X-ray rocking curves were measured for ω- and ω-2θ scanning modes ($\omega_n$- and $\omega_\alpha$- FWHM, respectively). X-ray diffraction data showed that GaN layer fabricated on porous layer had single crystalline structure of wurtzit GaN. The FWHM values of 40 arc sec of the ω-2θ rocking curves proved the high crystalline quality of the cap layers.

Concentration $N_d-N_a$ in fabricated GaN layer as measured by mercury probe at 1 MHz testing frequency was about $1.2 \times 10^{15}$.

The biaxial stresses in fabricated GaN layer was estimated according to the results of X-ray, Raman scattering and PL measurements. In the first case, the calculation of biaxial stresses and strain along c-axis in GaN layer was performed using measured values of radius of curvature R and lattice constant c. The measurements of lattice constant was performed using a triple crystal modification of the Bond method. The measured value of R and lattice constant c ($\Delta c=\pm 0.0001$ A) as well as calculated value of biaxial stresses $\sigma_a$ and strain $\epsilon_c=(c-c_0)/c_0$, where $c_0=5.1850$ A is a relaxed lattice constant for GaN were −10.8 m, 5.1801 A, 0.12 GPa and −0.94E3, respectively.

This confirmed that in GaN layer fabricated according to the method of the invention biaxial stress and strain were significantly reduced as compared to epitaxial layers grown on 6H—SiC, where the values of R, c, $\sigma_a$, and $\epsilon_c$ normally are −6.5 m, 5.1792 A, 0.6 up to 1.0 GPa and −1.2E3, respectively.

Raman scattering measurements were carried out at a room temperature using Ar$^+$ laser (λ=488 nm) as a source of excitation. The scattered radiation was analyzed by a double grating monochrometer with computer-controlled systems for scanning and data acquisition. A back scattering geometry with the z direction parallel to the optical axis of the crystal was employed. The analysis of the spectra measured showed, that the shift of the E$^2$ line towards lower frequencies as compared to its position for a strain-free sample points out to a tensile character of the in-plain stress in the fabricated layer. At the same time this shift was substantially less than that for a typical GaN layer grown directly on 6H—SiC substrate. As estimated from Raman data the GaN layer fabricated according to the method described in the invention had in-plain stress of σ≈0.20 GPa only. Also, fitting the $E^2$ line in the spectrum to the Lorenz function gave 3.1 cm$^{-1}$ value for FWHM's in the fabricated layer, again supporting the improvement in the crystalline structure of this layer as compared to GaN layers grown directly on SiC substrates.

The photoluminescence was excited by a pulse nitrogen laser with 2 kW pumping power. The position of the maximum of luminescence spectra taken at 77 K corresponded to neutral donor-bound exciton recombination in GaN. This exciton peak maximum for the fabricated GaN layer was blue-shifted by 22 meV relative to that for GaN layers grown on 6H—SiC, which maximum usually corresponds to 3.449 eV, which clearly pointed out to a reduction of stress in the layer fabricated according to the method of the invention by ~0.9 GPa. Also, the FWHM of the excitonic peak for the fabricated GaN layer was reduced to as low as 20 meV compared to that of the GaN layers grown directly on 6H—SiC substrates, where FWHM normally is about 32 meV. This feature indicated an improvement in the crystalline structure of GaN layer fabricated according to the method disclosed in the invention.

Comparison analysis of X-ray, Raman and PL data showed that the value of the biaxial stresses in GaN layer fabricated according to the method presented in the invention, is substantially less than that for the GaN layers grown directly on 6H—SiC substrates.

Similar results were obtained for growth of single crystal AlGaN layers having different composition on porous GaN and AlInGaN layers. Porous GaN and AlGaInN layer were formed by placing a group III nitride material in electrochemical cell. The porous material was formed by electrochemical etching in liquid electrolyte. Pores were formed both on material surface and inside the material. Thickness of porous layer depends on electrochemical etching duration. For example, to form 0.4 micron thick porous GaN layer it sakes about 0.5 minute. Pore size ranged from 0.01 to more than 1 micron and depended on current density.

Electron concentration in the layers used for porous layer, processing ranged from $10^{15}$ cm$^{-3}$ to $10^{20}$ cm$^{-3}$. Thickness of these layers ranged from 0.001 to 100 microns. These layers were grown on SiC, Si and other substrates. Thickness of AlGaN layers for different samples ranged from 0.5 micron to 10 mm. After the growth of single crystal AlGaN, including single crystal GaN material on porous GaN layer, the said porous layer was removed by mechanical polishing or etching resulting in free-standing AlGaN crystals.

EXAMPLE 2

Another example is a fabrication of a Silicon Carbide monocrystal layer. Monocrystal wafer to be processed in this case was commercial 4H—SiC wafer. Porous monocrystal SiC layer was developed by surface anodization of the wafer in 4%-aqueous solution of HF. The process was carried out without UV illumination at 15 mA/cm$^2$ current density during 5 minutes, which yielded the thickness of porous layer was about 2.5 microns. After the formation of porous SiC, the wafer was carefully cleaned to remove any residual chemicals.

Epitaxial monocrystal SiC layer was grown on porous layer using the chemical vapor deposition (CVD) method in a horizontal, cold-wall, atmospheric pressure reactor. The equipment of CVD technique used is known and has been adequately described in S. E. Saddow, M. S. Mazzola, S. V. Rendakova, V. A. Dmitriev, *Material Science and Engineering B*, B61–62, 158 (1999). The growth conditions were a Si to C ratio of 0.3, a growth temperature of approximately 1580° C. and the growth was conducted for one hour to yield a epitaxial layer thickness of about 2.5 μm. The concentration $N_d-N_a$ in the epitaxial layer was determined using capacitance-voltage measurements on Schottky barriers formed by thermal evaporation of Ni and its value was about 1.5×10$^{15}$ cm$^{-3}$.

The as-grown surface of the epitaxial layer was studied by reflection high-energy electron diffraction (RHEED) after exposition to air and the presence of stretched reflexes and visible Kikuchi lines in RHEED pattern indicated high crystalline quality of the surface of the layer. The good quality of the surface of the epitaxial layer fabricated was also confirmed by the results of an atomic force microscopy study. It showed that the layer had an extremely smooth surface with a root mean square roughness of about 0.2 nm.

The characterization of the crystalline structure of the fabricated layer was done by means of x-ray diffractometry (XRD). The measurements were performed using a triple-crystal x-ray spectrometer. A SiC single crystal grown by the Lely process was used as a monochromator and analyzer. X-ray rocking curves were measured for the (0008) reflection at (ω) and (ω,2θ) scanning modes using CuK$_\alpha$ radiation. XRD data showed that the fabricated epitaxial layer had a single crystalline structure associated with 4H—SiC. The rocking curves measured at (ω,2θ) mode from the fabricated layer exhibited two peaks, one of them corresponding to the reflection from the substrate while the other corresponded to the reflection from the epitaxial layer. The presence of two peaks indicated that the fabricated epitaxial layer had a c-axis lattice constant different from that of the substrate (Δd/d=−1.3×10$^{-4}$).

The results of transmission electron microscopy (TEM) characterization further proved the good crystalline structure of the fabricated epitaxial layer. The investigation was done on a EM-420 Philips microscope with a beam energy of 15 keV. The TEM data clearly showed that the presence of pores in the porous layer fabricated during the first step of the process did not lead to the formation of defects in the epitaxial layer grown during the second step. Both cross-sectional and plain-view TEM images taken in the basal plane did not show evidence of any dislocations present in the fabricated epitaxial layer. Considering the locality of the method, we can suggest that the density of dislocations in the investigated portion of the fabricated epitaxial layer was less than 5×10$^4$ cm$^{-3}$. It should be noted, that the dislocation density determined by TEM in the initial substrate was ~10$^6$ cm$^{-3}$.

In order to study electrically-active deep levels in fabricated SiC layer deep level transient spectroscopy (DLTS) was used. The measurements were performed in the temperature range from 80–600 K on Schottky barriers made on a portion of the fabricated layer. DLTS experiments did not reveal the presence of any levels in the upper half of the bandgap. In order to investigate deep levels located in the lower half of the bandgap, a p$^+$n structure was formed by growing a top p$^+$ layer on top of another portion of the fabricated layer, which was of n-type. The p$^+$-SiC layer was grown by liquid phase epitaxy. The DLTS measurements performed on these structures in the temperature range from 250–500 K did not reveal any DLTS peaks. The relative sensitivity of the DLTS set-up is about 10$^{-4}$, this indicated that the DLTS experiments could not detect any deep levels with concentrations less than $2 \times 10^{12}$ cm$^{-3}$ within the bandgap of the fabricated Silicon Carbide layer.

The optical properties of the fabricated layer were studied using a photoluminescence technique. The photoluminescence (PL) was excited at 80 K by a pulse from a nitrogen ($\lambda$=337.1 nm) laser with an optical pumping power density of 100 kW/cm$^2$. The PL spectrum of the fabricated layer was strongly dominated by donor-acceptor recombination band with a maximum at the 2.95 eV photon energy. The spectral features ($B_O$, $B_{LO}$), its shape and position corresponded to the data on low temperature luminescence of N—Al pairs in 4H—SiC (see, for example, M. Ikeda, H. Matsunami and T. Tanaka, *Phys. Rev. B*, 22, 2842 (1980). The deep level-related optical band at 2.06 eV, typical for SiC layers grown on conventional substrates, was substantially quenched. Also, the important feature of the spectrum of the fabricated layer was the exciton-related luminescence band (FE-TO, TO phonon related replica), at 3.17 eV. The emergence of this band obviously indicated good optical quality of the fabricated epitaxial layer.

The diffusion length of carriers in the fabricated layer was measured by Scanning Electron Microscopy (SEM) in Electron Beam Induced Current (EBIC) mode. The surface near the Schottky barrier was scanned perpendicular to the edge of the barrier. The acceleration voltage was 20 keV. The average diffusion length in the fabricated epitaxial layer exceeded 3 $\mu$m, while in SiC layers grown on the conventional substrate it is normally two times less.

Figure 1:
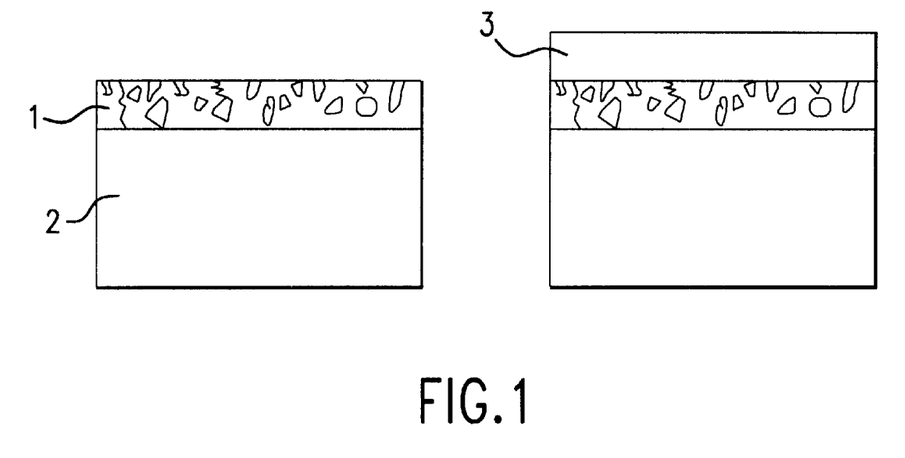
FIG. 1 is a schematic cross-section view of porous material (1) formed on a substrate (2), and layer grown on the porous material (3).
Figure 2:
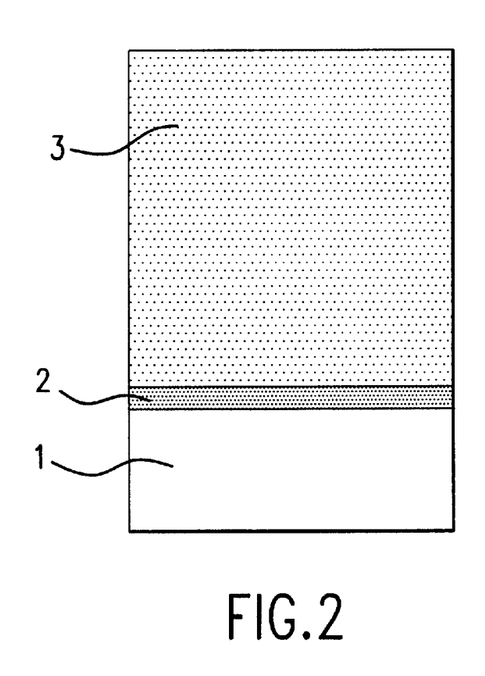
FIG. 2 is a schematic view of bulk crystal grown on porous material: 1 initial substrate, 2—porous region, and 3—bulk crystal. After the growth, the seed and porous layer can be removed resulting in bulk crystal with improved characteristics.
Figure 3:
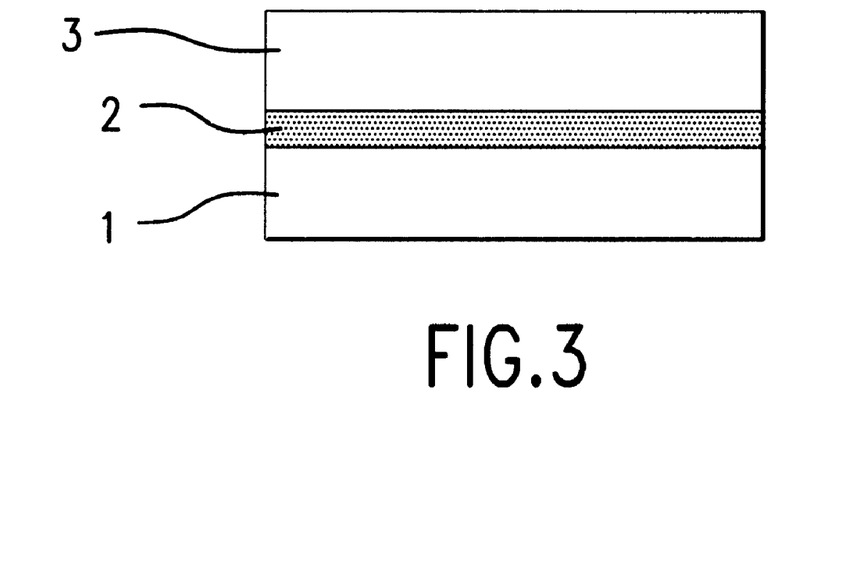
FIG. 3 is a single crystal layers grown on porous materials: 1—6H—SiC substrate, 2—porous SiC layer, and (3) single crystal 6H—SiC layer or single crystal multi layer SiC device structure (for example, SiC pn diode).
Figure 4:
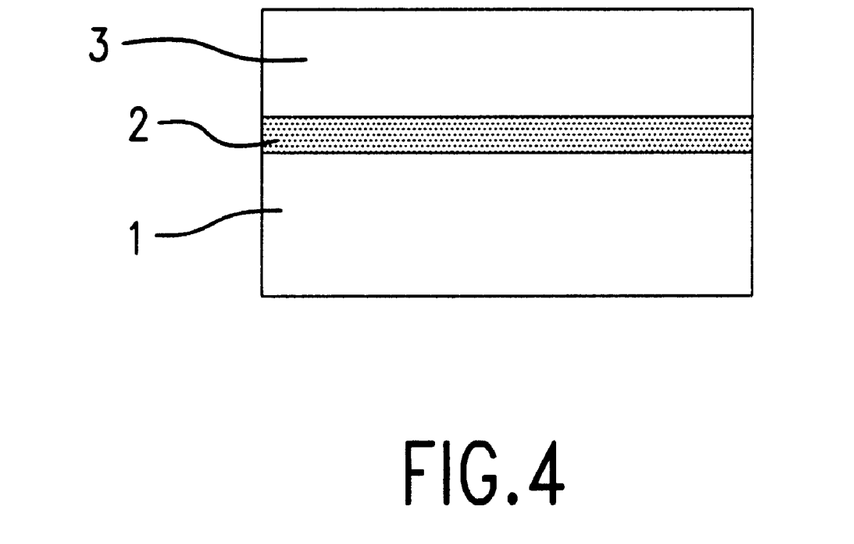
FIG. 4 is another example of single crystal layers grown on porous materials: 1—4H—SiC substrate, 2—porous GaN layer fabricated by anodization from continues single crystal GaN layer grown on the initial 4H—SiC substrate in a separate epitaxial run, and (3) single crystal GaN-based multi layer device structure ($1^{st}$ example of the device structure: LED structure consisting from AlGaN cladding layers, active InGaN layer situated in between the said cladding layer, and highly doped GaN contact layer; $2^{nd}$ example of the device structure: microwave power transistor: FET structure consisting of insulating AlN layer, conducting n-GaN channel layer, AlGaN gate layer, and contact highly doped layer).
Figure 5:
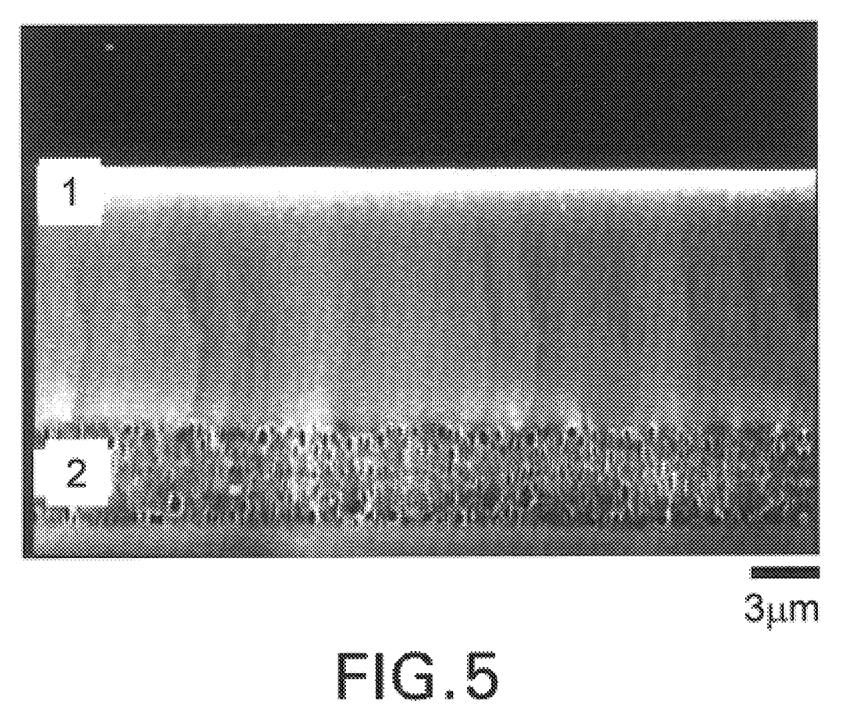
FIG. 5 illustrates a SiC layer (1) grown by sublimation method on porous SiC (2) formed on SiC substrate.
Figure 6:
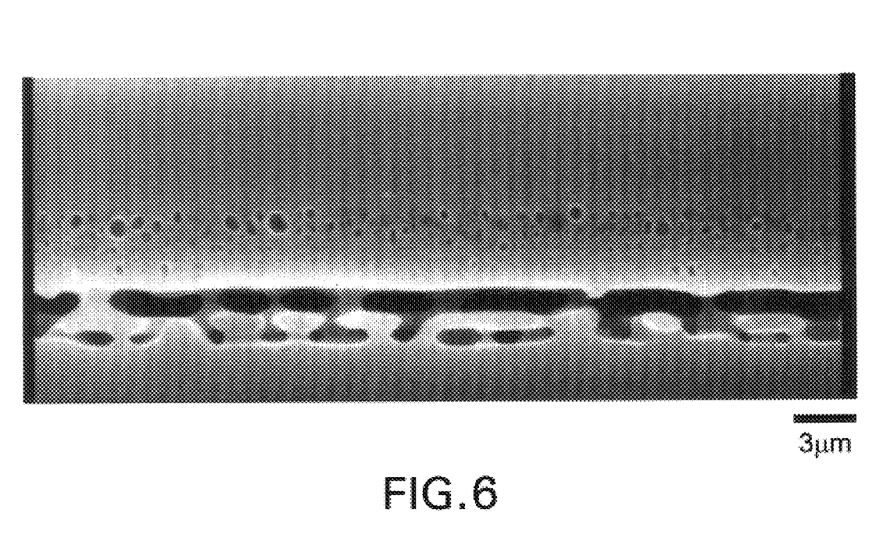
FIG. 6 shows a scanning electron microscopical image of crosssection of SiC sample. Voids formed from porous by heating prior and during CVD growth are clearly seen.
Figure 7:
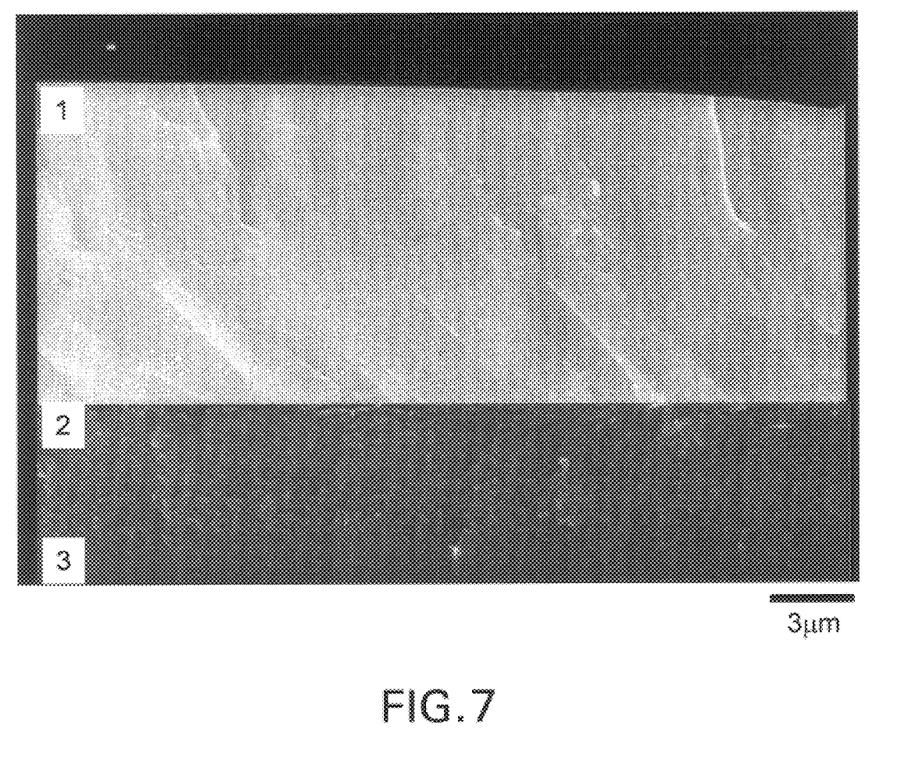
FIG. 7 is a GaN layer (1) grown by HVPE on porous GaN (2) formed on SiC substrate (3).
Figure 8:
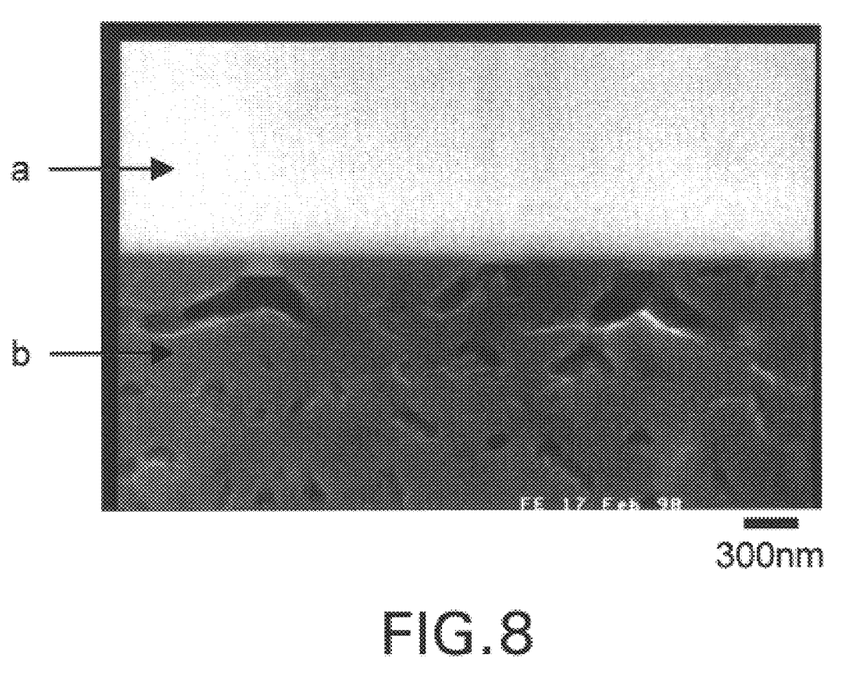
FIG. 8 is a GaN single crystal layer (1) grown on porous GaN layer (2).
Figure 9:
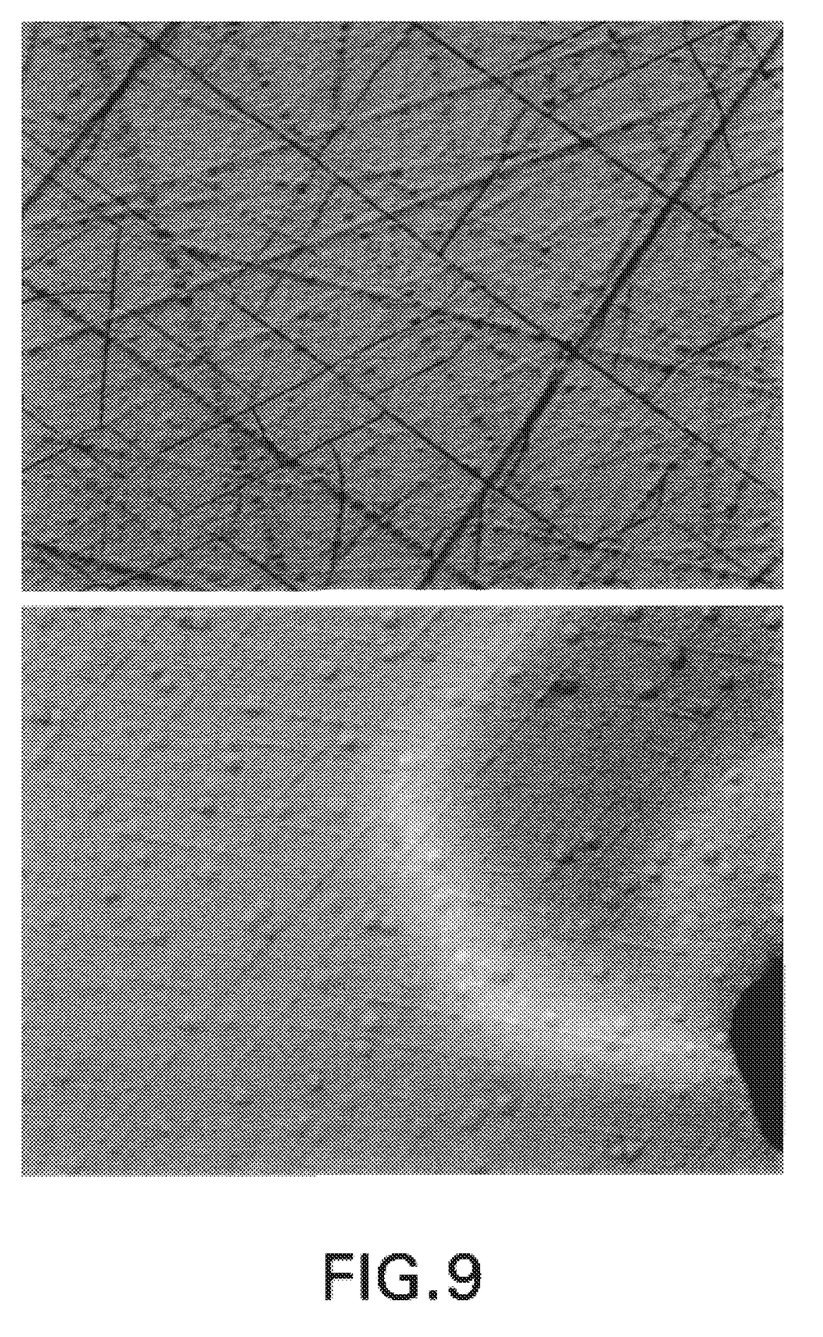
FIG. 9 illustrates surface morphology of AlN layer grown by HVPE on 6H—SiC substrate with (bottom) and without (top) porous SiC layer (×1000). Black spot in the bottom picture is a micropipe penetrated from SiC substrate.

It is important that during the heating of porous SiC, the pores were transformed in voids. As a result, there was a material region between initial SiC wafer and CVD layer containing large density of voids. These voids usually had largest dimension perpendicular to the [0001] crystallographic direction. Size of the voids usually ranged from 1 to few hundred microns. In some cases, the voids form continues cavity inside the material. The spacing between voids is usually larger than 0.1 micron. The formation of these voids is possibly responsible for the improvement of material characteristics. These voids (and cavities) may be used to separate grown monocrystalline layer from the initial wafer. Thus, GaN layers were separates from SiC wafer using voids form in SiC substrate.

Similar results were obtained using 6H—SiC wafers with diameter 30 mm, 41 mm, 50 mm and larger. Porous 6H—SiC layers with thickness larger than 0.01 micron were formed by different techniques. In some cases a half of the wafer was masked, and porous layer was formed on a half of the wafer. SiC CVD layer was grown on the whole SiC wafer giving a possibility to compare properties of SiC layer grown in the same epitaxial run on porous and standard substrate materials.

Similar results were obtained by growing single crystal SiC layer on porous single crystal SiC layer by liquid phase epitaxy in the temperature range from 1550 to 1750° C. Before the epitaxy, porous layer was annealed in vacuum at 950–1000° C. Si melt was used as solvent for the epitaxial growth. Both n-type and p-type SiC layers were grown. SiC pn junctions formed on porous SiC displayed superior characteristics including smaller concentration deep levels and larger diffusion length of minority electric carriers compared with pn junctions made on standard (non porous) substrate.

Similar results were obtained by growing group III nitride semiconductor layers on single crystal porous 6H—SiC and 4H—SiC substrates. These group III nitride semiconductor layers including GaN and AlN layers were grown by HVPE method. Material characterization results proved that these group III nitride semiconductor layers have less stress and crystal structure defects than layers grown on non porous SiC substrates.

These results show that the number of point defects in the layer fabricated according to the invention is significantly decreased compared to epitaxial layers grown by known techniques on standard substrates.

EXAMPLE 3

Another example is related to bulk crystal SiC growth by sublimation. 6H—SiC porous material was fabricated from 2 inch diameter 6H—SiC single crystal wafer. The wafer had (0001)Si face polished. On this face, 5 microns thick porous single crystal SiC layer was formed by anodization. The wafer having porous SiC layer was placed in high-temperature furnace and heated up to 2200° C. Bulk 6H—SiC crystal was grown by a standard growth procedure using sublimation growth method. After the growth, the crystal was removed from the furnace and the porous SiC layer was removed by polishing. SiC wafers fabricated by slicing and polishing from the bulk crystal had less defect density than SiC wafers grown on standard substrates.

The invention has been described in what is considered to be the most practical and preferred embodiments. It is recognized, however, that obvious modifications to these embodiments may occur to those with skill in this art. Accordingly, the scope of the invention is to be discerned from reference to the appended claims.

What is claimed is:

1. A method of fabricating monocrystal material comprising:
   a first step of processing a monocrystal wafer to develop a porous monocrystal layer,
   a second step of processing said monocrystal wafer with developed pores to transform at least some of the pores into voids, and
   epitaxially growing monocrystal material on said porous monocrystal layer.

2. A method of claim 1, where said monocrystal material being made of material having bandgap width exceeding 1.8 eV.

3. The method of claim 1, wherein the first step of processing comprises epitaxially growing a group III nitride material layer on the monocrystal wafer.

4. The method of claim 3, wherein the first step of processing further comprises processing said group III nitride material layer to develop pores.

5. The method of claim 1, wherein said monocrystal material is made of group III nitride material.

6. The method of claim 1, where said monocrystal wafer is made of silicon carbide.

7. The method of claim 6, wherein the silicon carbide wafer have surface orientation (0001).

8. The method of claim 1, wherein said epitaxially grown monocrystal layer is group III nitride semiconductor.

9. The method of claim 1, wherein said monocrystal material is made of silicon carbide.

10. The method of claim 1, further comprising the step of removing said porous monocrystal layer containing the voids.

11. The method of claim 1, wherein said voids are formed by heating said porous monocrystal layer.

12. The method of claim 1, wherein said voids are formed by annealing in vacuum.

13. The method of claim 12, wherein the annealing is performed in a temperature range from about 950 to about 1000° C.

14. The method of claim 1, wherein said voids are arranged at spacings higher than 0.1 micron.

15. The method of claim 1, wherein said voids have largest dimensions perpendicular to the [0001] crystallographic direction.

16. The method of claim 1, wherein said voids have size in a range from 1 to few hundred microns.

17. The method of claim 1, wherein said voids form continues cavities inside said monocrystal wafer.

18. The method of claim 1, wherein said voids are distributed uniformly over said monocrystal wafer.

19. The method of claim 1, wherein said porous layer has thickness from about 2.5 microns to about 5 microns.

20. The method of claim 1, wherein the said voids have thickness ranging from about 1 micron to about 3 microns.

21. The method of claim 1, wherein said voids have length ranging from about 1 micron to 100 microns.

22. The method of claim 1, wherein said voids are located inside said monocrystal wafer between the porous layer and a nonporous portion of the wafer.

23. The method of claim 1, wherein said voids are located at a distance of about 1 micron or more from wafer surface.

24. The method of claim 1, wherein said epitaxially grown monocrystal layer has thickness more than about 1 mm.

* * * * *